United States Patent
List et al.

(10) Patent No.: US 10,286,868 B2
(45) Date of Patent: May 14, 2019

(54) METHOD AND DEVICE FOR ASCERTAINING AN INNER RESISTANCE OF A SUPPLY NETWORK FOR SUPPLYING ENERGY TO AN OCCUPANT PROTECTION SYSTEM OF A VEHICLE

(71) Applicant: Robert Bosch GmbH, Stuttgart (DE)

(72) Inventors: Carsten List, Walheim (DE); Hartmut Schumacher, Freiberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 31 days.

(21) Appl. No.: 15/301,742

(22) PCT Filed: Mar. 26, 2015

(86) PCT No.: PCT/EP2015/056605
§ 371 (c)(1),
(2) Date: Oct. 4, 2016

(87) PCT Pub. No.: WO2015/158521
PCT Pub. Date: Oct. 22, 2015

(65) Prior Publication Data
US 2017/0036631 A1 Feb. 9, 2017

(30) Foreign Application Priority Data
Apr. 15, 2014 (DE) .................. 10 2014 207 171

(51) Int. Cl.
*B60R 21/017* (2006.01)
*G01R 31/00* (2006.01)
*G01R 17/10* (2006.01)

(52) U.S. Cl.
CPC ........ *B60R 21/0173* (2013.01); *G01R 31/005* (2013.01); *G01R 17/105* (2013.01)

(58) Field of Classification Search
CPC .. G01R 31/005; G01R 31/006; G01R 31/007; G01R 17/105; G01R 27/08; G01R 27/14; G01R 27/16
See application file for complete search history.

(56) References Cited

U.S. PATENT DOCUMENTS

| 4,835,513 | A | * | 5/1989 | McCurdy | ............ | B60R 21/0176 180/232 |
| 5,386,188 | A | * | 1/1995 | Minneman | ......... | G01R 19/0092 324/126 |

(Continued)

FOREIGN PATENT DOCUMENTS

| CN | 101477149 A | 7/2009 |
| DE | 102005058719 A1 | 6/2007 |

(Continued)

OTHER PUBLICATIONS

International Search Report dated Jun. 24, 2015, of the corresponding International Application PCT/EP2015/056605, filed on Mar. 26, 2015.

*Primary Examiner* — Huy Q Phan
*Assistant Examiner* — Dustin R Dickinson
(74) *Attorney, Agent, or Firm* — Norton Rose Fulbright US LLP; Gerard Messina

(57) ABSTRACT

A method for ascertaining an inner resistance of a supply network for supplying energy to an occupant protection system of a vehicle. The occupant protection system includes a charging unit connected to the supply network using a primary interface and to an energy buffer store using a secondary interface for the temporary storage of energy for activating occupant protection devices system and for supplying the system after being separated from the supply network. The method includes impressing a first charge current value at the secondary interface, and a first current/voltage at the primary interface during the impression.

(Continued)

Further, a second, different, charge current value is impressed at the secondary interface. The method also includes determining a second current/voltage at the primary interface during the impression, and ascertaining the inner resistance of the supply network, using the detected first current and second current and/or the first voltage and the second voltage.

13 Claims, 5 Drawing Sheets

(56) References Cited

U.S. PATENT DOCUMENTS

| | | |
|---|---|---|
| 6,114,838 A | 9/2000 | Brink |
| 6,580,279 B1* | 6/2003 | Baumgartner ........ G01R 31/006 307/10.1 |
| 2004/0196615 A1* | 10/2004 | Bennett ............... B60R 21/0173 361/247 |
| 2005/0231218 A1 | 10/2005 | Steinmill |
| 2007/0030016 A1* | 2/2007 | Schumacher ....... B60R 21/0173 324/678 |
| 2013/0124051 A1* | 5/2013 | Sievers ................ B60R 21/017 701/45 |
| 2014/0009178 A1* | 1/2014 | Bai ........................ G01R 27/02 324/713 |
| 2014/0049261 A1* | 2/2014 | Flack ................... G01R 31/025 324/509 |
| 2015/0091591 A1* | 4/2015 | Charles ................. G01R 27/02 324/691 |

FOREIGN PATENT DOCUMENTS

| | | |
|---|---|---|
| JP | 2013526258 A | 6/2013 |
| WO | 2014001011 A1 | 1/2014 |

* cited by examiner

METHOD AND DEVICE FOR ASCERTAINING AN INNER RESISTANCE OF A SUPPLY NETWORK FOR SUPPLYING ENERGY TO AN OCCUPANT PROTECTION SYSTEM OF A VEHICLE

FIELD

The present invention relates to a method for ascertaining an inner resistance of a supply network for supplying energy to an occupant protection system of a vehicle, to a corresponding control unit or a corresponding device as well as to a corresponding computer program product.

BACKGROUND INFORMATION

A highly reliable ground connection on the vehicle chassis is used to safely supply an airbag control unit. On the control unit side, the provided chassis ground is generally connected to the circuit board via redundant electrical connections (e.g., screw connections, press-fit connections). The variant of the ground connection via the airbag power cable with the aid of one or multiple plug connections, combined with a press-fit or solder connection to the circuit board, is also used.

The positive supply line (KL15R, KL15, UBAT, etc.) is generally provided singularly or redundantly via the airbag power cable with the aid of one or multiple plug connections, combined with a press-fit or solder connection to the circuit board. The electrical properties of the airbag supply connection do not facilitate a safe self-diagnosis at a sufficiently high control unit supply voltage. In particular, there is no information on how the supply voltage behaves when more power is needed from the control unit. Intact supply connections normally guarantee supply inner resistances of (100 . . . 400) mΩ. These resistances are essentially determined by the copper resistors of the supply lines and the contact resistors. The share generated by the inner resistances of the vehicle battery or the generator (generator controller) is very low (approximately 10%).

Today, the error detection in the airbag supply network is limited to serious errors, such as generator controller failure, battery failure and interrupted supply line. This takes place through constant monitoring of the supply voltage with the aid of error detection in the case of undervoltage and overvoltage as well as service measures that provide a check of ground connections to the vehicle chassis.

SUMMARY

Against this background, a method is provided for ascertaining an inner resistance of a supply network of an occupant protection system of a vehicle, as well as a device or a control unit which uses this method and finally a corresponding computer program product in accordance with the present invention. Advantageous embodiments result from the description herein.

A method is provided for ascertaining an inner resistance of a supply network for supplying energy to an occupant protection system of a vehicle, the occupant protection system including a charging unit, which is connected to the supply network with the aid of a primary interface and to an energy buffer store with the aid of a secondary interface for the temporary storage of energy for activating occupant protection devices of the occupant protection system and for supplying the occupant protection system after being separated from the supply network, the method including the following steps:

impressing a first charge current value at the secondary interface;

detecting a first current and/or a first voltage at the primary interface during the injection step;

impressing a second charge current value, which differs from the first charge current value, at the secondary interface;

determining a second current and/or a second voltage at the primary interface during the impressing step; and ascertaining the inner resistance of the supply network, using the first current and the second current and/or the first voltage and the second voltage.

An inner resistance of the supply network of the occupant protection system may be understood to be a resistance which is made up of multiple partial resistances. These partial resistances are formed by the generator or battery, the contact resistors of all contacting units used in the supply circuit and the transport resistors (Cu lines; vehicle chassis) in the supply circuit.

A supply network of the occupant protection system may be understood to be an electrical network which is designed to supply this occupant protection system with electrical operating energy. The overall supply network may also include networks to other electrical consumers in different locations within the vehicle.

A charging unit may be understood to be, for example, a current controller or voltage controller which charges an energy buffer store with electrical energy from the supply network in the control unit of the occupant protection system. An occupant protection system may be understood to be a system of control unit(s) which suitably activate(s) different types of protective elements (devices) in interaction with internal as well as external sensors in the case of a defined event, such as a crash, for the purpose of minimizing or avoiding injuries to a person either in the vehicle or outside a vehicle.

The energy buffer store may be understood to be an electrical storage element, such as a capacitor or a rechargeable battery, to which electrical energy is fed from the supply network, the energy stored in the energy buffer store ensuring a supply of the occupant protection system over a defined period of time even if the supply is interrupted (autonomy), and the energy buffer store being able to supply energy for activating the individual occupant protection elements (airbag; seatbelt tensioner, etc.).

A primary interface may be understood to be an interface of the charging unit for receiving electrical power from the supply network, while a secondary interface may be understood to be an interface of the charging unit for outputting electrical power and energy to the energy buffer store. An impression of a charge current value may be understood to mean the setting of a current flow having a certain value (which also includes the value of zero amperes) at the secondary interface.

The approach presented herein is based on the finding that an additional safety function may be implemented with the aid of technically very easily applicable additional evaluation options of parameters detected in or at the charging unit or its interfaces. In particular, a loading or a load change during a drawing of energy from the supply network may be effectuated by detecting the current and/or the voltage at the primary interface upon a change of the current flow from the secondary interface to the energy buffer store. With the aid of this load change, a conclusion may then be drawn as to the inner resistance of the supply network, which permits, for example, an indication of a poor electrical connection in terminals of connecting cables.

The approach presented herein offers the advantage that, by advantageously linking parameters which are usually already present or measurable, it is possible to check the quality of an electrical connection in connecting cables of the charging unit or an occupant protection system equipped with the charging unit without requiring an additional sensor. For example, the presence of corroded connections may then be inferred from the determined quality of the electrical connection if the inner resistance of the supply network exceeds a certain threshold value. In this case, an error message may be output to motivate the user of the vehicle to visit a repair shop for the purpose of eliminating this defect, for example by replacing or cleaning a corroded connection.

A specific embodiment of the present invention is favorable, in which the primary current change is determined during the transition from a first charge current value to a second, secondary charge current value in the step of ascertaining the inner resistance using an efficiency of the charging unit. Such a specific embodiment of the present invention makes it possible to ascertain the inner resistance of the supply network based on only a very small number of measured parameters. In this way, the probability of an erroneously determined inner resistance based on a measuring error is largely reduced.

According to another specific embodiment of the present invention, the voltage at the primary interface may be low-pass filtered in the step of detecting a first secondary charge current value and/or in the step of determining a second secondary charge current value during the impressing step. Such a specific embodiment of the present invention offers the advantage that short-term fluctuations in the current and/or the voltage during the measurement remain unremarkable, so that the probability of an erroneously determined inner resistance of the supply network is significantly reduced.

A specific embodiment of the present invention is furthermore possible, in which a second secondary charge current value is impressed, which is greater than the first charge current value. In particular, the second charge current value, compared to the first charge current value, may be selected in such a way that an inner resistance which must be smaller than a predetermined inner resistance of the supply network in the error-free state may be determined in the determination step from the voltage change and/or the detected current change at the primary interface during the transition from charge current value 1 to higher charge current value 2 on the secondary side.

Such a specific embodiment of the present invention offers the advantage of being able to particularly precisely determine the inner resistance of the supply network. By selecting the second charge current value in relation to the first charge current value, in particular, it is possible that the particular current change and/or the particular voltage change (in the case of an error) at the primary interface is/are sufficiently large, so that low values of the inner resistance of the supply network may also be sufficiently accurately resolved.

According to another specific embodiment of the present invention, the specification of a second secondary charge current value may take place after a predetermined period of time for specifying the first secondary charge current value. For example, the second charge current value may take place within a time period of 1 millisecond to 100 milliseconds after the first charge current value is impressed at the secondary interface. Such a specific embodiment of the present invention offers the advantage of preferably minimizing a change in parameters of the supply network, such as an increase in a battery temperature, including an associated change in the inner resistance of the supply network.

One specific embodiment of the present invention may be particularly easily technically implemented, in which the inner resistance is determined in the determination step, using a lookup table, and/or the current and/or the current change at the primary interface being determined in a detection step, using a lookup table. In such a specific embodiment of the present invention, the execution of numeric or circuit-wise time-consuming operations and energy-consuming mathematical operations may be dispensed with.

According to one specific embodiment of the present invention, the steps of detection during the specification of a first secondary current and ascertainment during the specification of a second secondary current value may be carried out chronologically multiple times consecutively, and the inner resistance calculation may take place after each sub-step, which ultimately results in the determination of the final inner resistance from the stored partial results according to a mathematical algorithm (averaging; discarding of outliers, etc.), or the inner resistance calculation is carried out directly from the stored raw values of primary current and primary voltage from the sub-steps according to a mathematical algorithm (averaging; discarding of outliers, etc.). Such a specific embodiment of the present invention offers the advantage that random disturbances or special phenomena, for example after long vehicle standstill periods, may be preferably excluded during the determination of the inner resistance of the supply network.

One specific embodiment of the present invention is particularly advantageous as a method for outputting an error message for providing information on a malfunction of a supply network for the static supply of energy to an occupant protection system of a vehicle, in particular to the electronic control unit of this system, the method including the following steps:
 the steps of a method according to one variant to be presented herein; and
 providing the error message when the inner resistance is in a predetermined relationship to a resistance threshold.

Such a specific embodiment of the present invention offers the advantage of an early warning if the inner resistance meets a certain criterion or a predetermined relationship to a resistance threshold, for example if the inner resistance of the supply network is higher than the resistance threshold. In this way, a conclusion may then be drawn, for example, to a poor quality of an electrical connection in a connector or a terminal contact of the supply network, so that a function of the electronic control unit of the occupant protection system may possibly no longer be able to be carried out correctly from the supply network, such as reduced robustness in the case of triggering circuit short circuits due to a ground shift or reduced performance of the redundant activation of occupant protection devices (devices such as airbags, seatbelt tensioners, etc.).

One specific embodiment of the present invention is also favorable as a device for ascertaining an inner resistance of a supply network for supplying energy to an occupant protection system of a vehicle. The electronic control unit of this system may include a charging unit, which is connectable to the supply network with the aid of a primary interface and to the energy buffer store with the aid of a secondary interface for the temporary storage of energy for the autonomous supply of the occupant protection system, e.g., in the event of a crash, and for the provision of activation energy to occupant protection devices of the occupant protection system after the occupant protection system (the electronic control unit in this case) is separated from the supply network. The device includes the following features:

- a unit for impressing a first charge current value at the secondary interface, including zero (no current);
- a unit for detecting a current and/or a voltage at the primary interface during the impression;
- a unit for impressing a second charge current value, which differs from the first charge current value, at the secondary interface;
- a unit for detecting a current and/or a voltage at the primary interface during the impression of the second secondary charge current value; and
- A unit for determining the inner resistance of the supply network, using the detected current or the primary current ascertained from the knowledge of the level of the impressed secondary current with the aid of a physical relationship, or the change thereof to a design-dependent offset, and/or the detected voltage during the step of impressing a first secondary current value and using the detected current or the primary current ascertained from the knowledge of the level of the impressed secondary current with the aid of a physical relationship, or its change to a design-dependent offset, and/or the detected voltage during the step of impressing a second secondary current value.

The approach presented herein thus also provides a device which is designed to carry out or implement the steps of one variant of a method presented herein in corresponding systems. This embodiment variant of the present invention in the form of a device also makes it possible to achieve the object underlying the present invention rapidly and efficiently.

In the present case, a device may be understood to be an electrical unit (electronic control unit of an occupant protection system), which processes sensor signals and outputs control and/or data signals as a function thereof. The device may have an interface which may be designed as hardware and/or software. In the case of a hardware design, the interfaces may be, for example, part of a so-called system ASIC, which includes a wide range of functions of the device. It is, however, also possible that the interfaces are independent, integrated circuits or are at least partially made up of discrete elements. In the case of a software design, the interfaces may be software modules which are present, for example, on a microcontroller in addition to other software modules.

A computer program product having program code is also advantageous, which may be stored on a machine-readable carrier, such as a semiconductor memory, a hard disk memory, or an optical memory, and is used for carrying out the method according to one of the specific embodiments described above when the program product is executed on a computer or a device. According to one specific embodiment, the present invention thus also provides a computer program product having program code for carrying out the method according to one variant presented herein when the program product is executed on a device.

Example embodiments of the present invention is explained in greater detail below, as examples, based on the figures.

DETAILED DESCRIPTION OF EXAMPLE EMBODIMENTS

Figure 1:
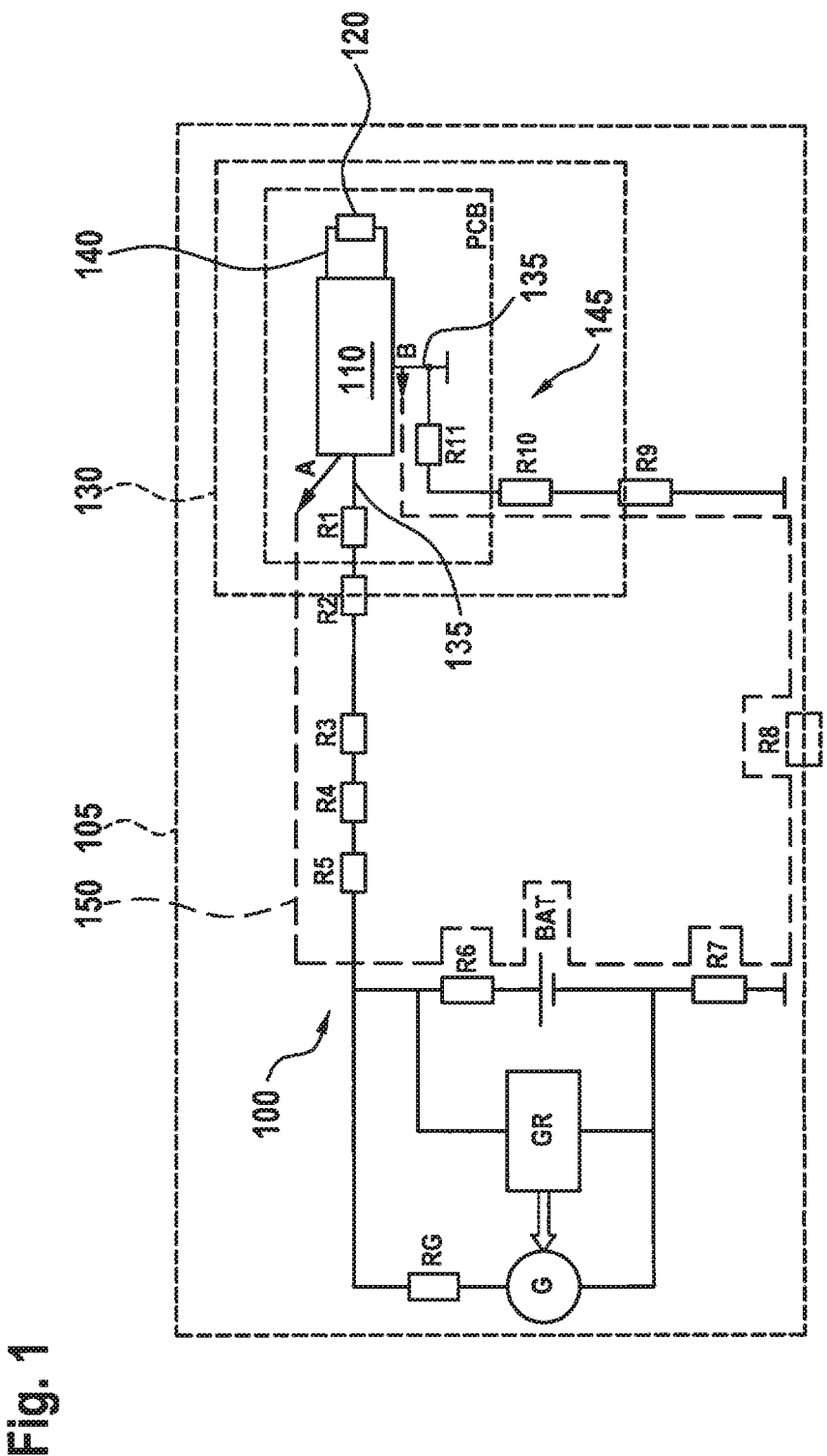
FIG. 1 shows a circuit diagram of a device for use in one exemplary embodiment of the present invention.

In the following description of favorable exemplary embodiments of the present invention, the elements which are illustrated in the various figures and have similar functions are identified by identical or similar reference numerals, a repeated description of these elements is dispensed with.

One aspect of the present invention lies in an option to provide a means for forcing a targeted service or maintenance visit in a repair shop by detecting, for example, an excessively high supply inner resistance of a vehicle electrical system (sub-network) (as a supply network of a vehicle; the safety-relevant supply network of an occupant protection system in this case) and to eliminate a safety-relevant influence, in particular in systems without a redundant supply connection (as is the case, for example, in an all-plastic housing, carbon chassis or the like). The ground connection exposed to corrosion is generally an important source of errors.

The robustness of the system against system errors may be increased by detecting critical (i.e., excessively high) inner resistances, for example of the vehicle airbag supply. In particular, the negative impact of excessively high ground resistances of the airbag supply on short circuits in triggering circuits are avoided (fault currents over squibs). The robustness of large airbag systems, in particular integrated safety units, having a high current consumption, may be brought to the level of today's small airbag systems with respect to shunts in triggering circuits without requiring redundant supply paths.

Airbag systems may dispense with, for example, a redundant supply connection, in particular, of the ground. This has advantages for the housing design (e.g., all-plastic or by using the ground connection via the plug connection in chassis made of carbon, etc.). It is also recognized in good time whether backup structures for restraint device activation (firing) from the vehicle battery (and not the energy buffer store) would be effective.

FIG. 1 shows an example of a circuit diagram of a supply network 100 of a vehicle 105, which is connected to a charging unit 110 of an energy buffer store 120 of an occupant protection unit 130, e.g., an electronic control unit, as part of an occupant protection system. Charging unit 110 (which is provided here as part of an airbag (control unit) supply ASIC) is connected to supply network 100 via a primary interface 135 having terminals A and B. Charging unit 110 is also connected to energy buffer store 120 with the aid of secondary interface 140, which is situated together with charging unit 110 on a shared circuit board PCB. This circuit board PCB may be situated on a base plate 145. Supply network 100 includes a generator G, a generator inner resistor RG and a generator controller GR, which charge a battery BAT (for example, a rechargeable vehicle battery) to a certain voltage.

In FIG. 1, an overview shows which inner resistance of the vehicle electrical system is to be determined with the aid of the approach presented herein. The sum of all resistances between positive terminal A and ground terminal B of the control unit or charging unit 110 is determined. In other words, the inner resistance of supply network 100 is determined at primary interface 135. This inner resistance includes the sum of all resistances between points A and B. In particular, the inner resistance to be determined (along measurement path 150) thus includes the following resistances:

R1: Σ of all resistors on PCB from the connector of the control unit for positive supply to airbag (control units) circuit supply (e.g., track resistor; etc.)

R2: Σ of all contact resistors of plug connection UBAT to the circuit board (e.g., plug contact; press-fit contact)

R3: Σ of all Cu resistors of the cable UBAT connection from the battery positive terminal to the airbag control units UBAT+connector pin R4: Σ of all resistors of the fuses in the feed line R5: Σ of all contact resistors in the UBAT-+ connection to the battery (ignition lock; main fuse, etc.)

R6/RG: (R6 is active) Inner resistance of the vehicle battery (if motor off, generator stopped or RG inner resistance of the generator if motor is on, generator running)

R7: Transfer resistance, battery/generator ground connection to chassis

R8: Chassis inner resistance

R9: Transfer resistance, vehicle chassis to control unit base plate

R10: Σ of all contact resistors, control unit base plate to PCB ground connection R11: Σ of all resistors from PCB ground connection to ground supply of the supply circuit (e.g., track, resistor, etc.)

All changes to resistances are detected thereby. In reality, the contact resistors, in particular, are a source of error, in particular the ones exposed to increased corrosion (such as ground connections to the vehicle chassis).

Figure 2:
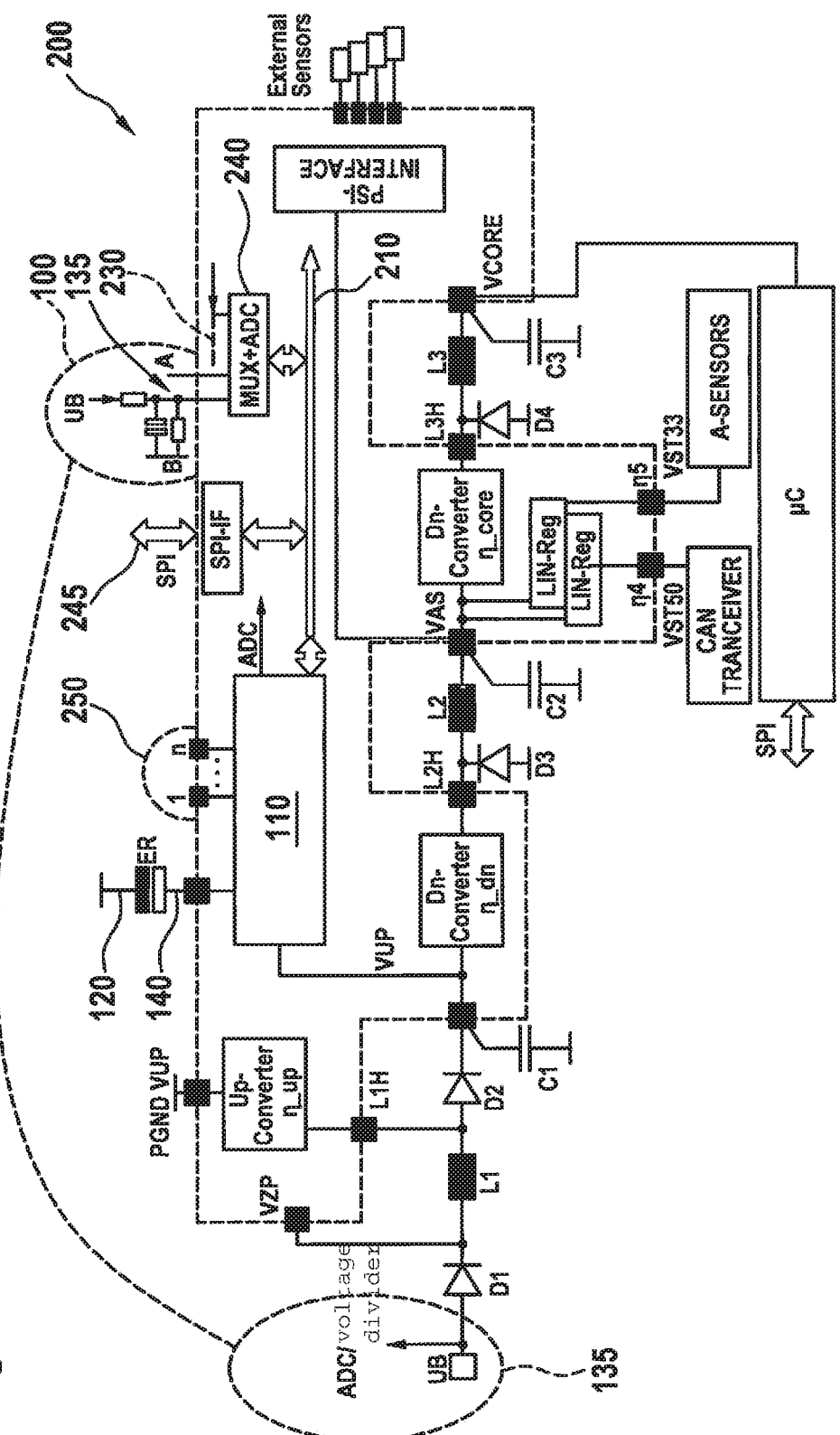
FIG. 2 shows a circuit diagram of a device for use in one exemplary embodiment of the present invention.

FIG. 2 shows a circuit diagram of a power supply circuit 200, which includes a charging unit 110 for use in one exemplary embodiment of the present invention. Charging unit 110 is connected to energy buffer store 120, which is also identified by the abbreviation ER, via secondary interface 140. Primary interface 135 is shown on the left in FIG. 1. The pure voltage measurement (UB) takes place via low-pass filter Mux+ADC. If a primary current measurement is needed in addition to pure voltage measurement UB in complex situations between the primary and secondary current, which are unable to be stored in tables, a shunt is inserted into the primary supply line, and another voltage measuring channel is run to a second MUX channel of the ADC via a second, identical low pass. Power supply circuit 200 includes multiple units, such as a controllable step-down converter (Dn converter) for generating system voltage VA S, needed for supplying the sensor interface according to the PSI standard, a controllable step-up converter for providing a high voltage level (VUP=20V . . . 50V) for optimum energy storage, an energy buffer store, at least one acceleration sensor A_Sensor, a microcontroller µC and an SPI interface SPI. The power supply circuits have an efficiency of generally ηx, e.g., (η_up for the step-up converter, η_dn for the VAS step-down converter, etc.)

Charging unit 110 is furthermore connected to serial peripheral interface (SPI) 245 via an ASIC-internal bus 210 at the other ASIC function blocks, such as the central multiplexer+ADC.

Moreover, analog measured variables (signals) are present at multiplexer+ADC (240), in particular the energy buffer store voltage and optionally the charge current of the charging unit.

The electrical energy supplied from supply network 100 may supply the up coverer and its external components, e.g. L1 and D2, charging unit 110 and, in parallel, the VAS step-down converter, via polarity reversal protection diode D1. A redundant supply path may likewise branch from terminal UB in the control unit of the supply network for activating the occupant protection devices.

Terminal UB of the control unit to power supply 200 detects supply voltage UB via connected multiplexer+ADC 240, using a low-pass filter 220, formed, for example by a resistive voltage divider having a capacitance between a connecting point A and a ground potential B (integrated or partially integrated into the airbag control unit system ASIC). As a result, the UB voltage measured value is transferable to the microcontroller upon the SPI command of the microcontroller via ASIC-internal bus 210 and the SPI interface.

A differential voltage measurement may also be optionally carried out via a low-impedance shunt, which is connected in series upstream or downstream from diode D1 in the UB/VZP line, using additional input measuring channels of the multiplexer, and the supply current may thus be determined directly from the differential voltage measurement. The power or energy consumption may be determined directly from the measurement of supply voltage UB and the optionally measured input current by integration over time in the microcontroller.

If the optional current measurement is not carried out, the change in the primary current consumption may be determined from the change in the current output of charging unit 110 with the aid of the efficiency of step-up converter η_up, if the control unit configuration ensures that the current demand over the VAS step-down converter remains constant. The change in power consumption from the supply network may be ultimately determined thereby.

For this purpose, charging unit 110 is programmable or controllable in such a way, for example, that different charge current values (IER) may be impressed at secondary interface 140 at different points in time. This means that charging unit 110 is controlled in such a way that currents of different sizes flow into energy buffer store 120 via secondary interface 140, and the charging speed increases or decreases thereby. For example, the programming or control of this current charging behavior at secondary interface 140 may take place via multiple programming connections 250, which are connected in parallel to I/Os of the microcontroller or to the charging unit with the aid of microcontroller SPI commands, which are transmitted to the charging unit or any other type of command transmission of the microcontroller. These different charge current values IER of the secondary interface have the effect that different currents IBAT and/or voltages UBAT also occur at different points in time at the primary interface in the UB feed line to D1 (observed via low-pass filtered analog measuring channels 135).

To determine supply inner resistance R, an airbag control unit supply voltage measurement should be carried out at an input current I1{IBAT(t1)} and at an input current I2{IBAT(t2)}, close to each other in time, at points in time t1 and t2, at primary interface 135. The difference in input currents I1, I2 should be selected to be so great that relevant resistances (0.5 . . . 1.5) Ω are resolvable. The resolution limit should be approximately <=100 mΩ for airbag systems.

To protect the measurement against interference voltages, load changes in the vehicle electrical system, etc., they are to be suitably filtered. In addition to low-pass filter 220, this also includes, for example, a multiple (>=3) rapid repetition of the measurement, including checking of the input voltage before and after the measurement.

A filtering of the error over multiple start operations is also suitable for ruling out random errors or special phenomena after long vehicle standstill times.

According to a first exemplary embodiment of the present invention, the inner resistance of the supply network may be very favorably detected. Airbag control units form the conventional basis for the approach, which include an step-up converter for generating a regulated output voltage VUP (20 . . . 50)V, e.g. 33V, from polarity reversal-protected vehicle voltage VZP (5 . . . 20)V, and, on the one hand, provide a regulated output voltage VAS (6 . . . 8) V e.g. 6.7V, therefrom via a step-down converter for the further low-loss generation of the necessary system voltages (5V; 3.3V; 1.2V, etc.), and, on the other hand, include an ON/OFF-switchable energy buffer store charge current controller for charging the ER from VUP.

The approach proposed herein adds to this base in the area of the hardware with a new, selectable energy buffer store charge current value, which meets the requirements for ascertaining supply inner resistance R according to the illustration in FIG. 1, without providing a completely new measuring device at the supply terminals.

This means that the energy buffer store charge current controller (i.e., charging unit 110) is designed in such a way that at least two different charge current control values may be selected for the deactivation (charge current value zero). One value is used for normal charging of energy buffer store 120 or ER according to the system requirement, a second (for example higher) value is used for the primary increase in the airbag supply current in addition to the short-term, secondary (faster) energy buffer store charge, for the purpose of setting current value I2 for the inner resistance measurement.

In another optimization, the control current value of charge current controller 110 may be programmed in a determined interval and thereby optimally matched to the different requirements.

The following relationship applies between the input and the output of a step-up converter:

$$\text{Pout}=\eta \times \text{Pin} \to P\_vup = \eta\_up \times P\_vzp \quad A)$$

VUP=step-up converter output voltage,
VZP=step-up converter input voltage,
P_vup=step-up converter output power,
P_vzp=step-up converter input power,
η_up is the efficiency of the converter.

In a first approximation, the latter is constant. For real systems, however, it is dependent on the input voltage and the output current.

For the application case of the airbag control units, it is sufficient to take into account the essential voltage dependency. The latter is apparent, in particular, in low input voltages VZP=5V . . . 8V; it becomes increasingly smaller for higher voltages VZP>8V.

For the airbag application case, relationship A) may be further detailed and with the aid of a gradation of a maximum of 8 VZP ranges to a minimum of 3 VZP ranges may be very well to well approximated:

Gradation into 8 VZP ranges:

$$P\_vup = \eta\_up(5.5V \ldots 6.0V) \times P\_vzp; \text{ e.g., } \eta\_up(5.5V)=0.7$$

$$P\_vup = \eta\_up(6.0V \ldots 6.5V) \times P\_vzp; \text{ e.g., } \eta\_up(6.0V)=0.75$$

$$P\_vup = \eta\_up(6.5V \ldots 7.0V) \times P\_vzp; \text{ e.g., } \eta\_up(6.5V)=0.8$$

$$P\_vup = \eta\_up(7.0V \ldots 8.0V) \times P\_vzp; \text{ e.g., } \eta\_up(7.0V)=0.825$$

$$P\_vup = \eta\_up(8.0V \ldots 9.0V) \times P\_vzp; \text{ e.g., } \eta\_up(8.0V)=0.85$$

$$P\_vup = \eta\_up(9.0V \ldots 10.0V) \times P\_vzp; \text{ e.g., } \eta\_up(9.0V)=0.875$$

$$P\_vup = \eta\_up(10.0V \ldots 12.0V) \times P\_vzp; \text{ e.g., } \eta\_up(10.0V)=0.9$$

$$P\_vup = \eta\_up(>=12.0V) \times P\_vzp; \text{ e.g., } \eta\_up(6.5V)=0.9125 \quad A1)$$

Gradation into 3 VZP ranges:

$$P\_vup = \eta\_up(5.5V \ldots 7.0V) \times P\_vzp; \text{ e.g., } \eta\_up(6.0V)=0.75$$

$$P\_vup = \eta\_up(7.0V \ldots 9.0V) \times P\_vzp; \text{ e.g., } \eta\_up(8.0V)=0.85$$

$$P\_vup = \eta\_up(>=9.0V) \times P\_vzp; \text{ e.g., } \eta\_up(10V)=0.9 \quad A2)$$

Note the following for defining the ER charge current value for determining supply inner resistance R:

A supply voltage resolution of δUBAT_ADC=(23.4 . . . 29.3) mV per digit may be achieved by using, for example, a 10-bit ADC (i.e. the ADC from FIG. 2) for the supply voltage measurement in the 0 . . . (24 . . . 30V) range at primary interface 135. This results in an inner resistance resolution of δRBAT=δUBAT_ADC/δIBAT.

If δRBAT<=100 mΩ is necessary, A3) δIBAT=δUBAT_ADC/δRBAT(<=100 m)/is required. δIBAT is the necessary current change from I1 to I2→δIBAT=[(I2-I1)] for the purpose of resolving a supply inner resistance at a given voltage resolution of the UBAT measurement.

The following applies for δUBAT_ADC=25 mV and δRBAT=100 mΩ:

$$\delta IBAT = 25 \text{ mV}/100 \text{ m}\Omega = 0.25 \text{ A}$$

The new charge current control value of energy buffer store ER may now be determined therefrom via secondary interface 140 for inner resistance measurement of inner resistance R.

To use an increase in the supply current of the airbag control unit or power supply circuit 200 in a targeted manner for measuring purposes, the most meaningful and most cost-effective approach for the overall system is to do this by using an energy buffer store charge current circuit 110. An existing unit 110 is only improved thereby (costs), and the increased energy consumption is used for the purpose of charging the energy buffer store.

Applied to the overall control unit, step-up converter relationship A) results in the following relationship:

$$p\_ubat = p1+p2+p3+p4 = p1+p2+(VUP \times lup\_dn)/\eta\_up + (VUP \times IER)/\eta\_up \quad \quad B)$$

where p1=power loss of polarity reversal protection diode D1 p2=is the sum of all consumptions from UBAT or VZP which are primarily required by the control unit for auxiliary functions (e.g., divider transverse currents of measuring device 135, reference currents, communication currents through pull-up resistors for UBAT, VZP, etc.). This power is generally low; in particular, its fluctuation may be disregarded.

p3=VZP*IBAT3=(VUP×lup_dn)/$\eta$_up represents the power which should be output in the present operating case to maintain the functionality of the airbag system to the VAS step-down converter. The airbag functionality is not to be expanded during the measurement, whereby p3 may be assumed to be constant.

p4=VZP*IBAT4=(VUP×IER)/$\eta$_up represents the power which is to be additionally provided at the input of the airbag control unit, when charging the energy buffer store, for the purpose of achieving a certain charge current.

If current IER is changed from 0 to IER_TEST, the current increases at VZP and thus at UBAT by B1) $\delta$IBAT=VUP×IER_TEST/($\eta$_up×VZP).

If the vehicle electrical system voltage, e.g. UBAT=16.5V, corresponds to step-up converter output voltage VUP=33V at the point in time of the inner resistance measurement, polarity reversal-protected voltage VZP (when using Schottky diodes) is Ud=0.5V lower than UBAT.

From $B1$) and $A2$)→$B2$) $IER\_TEST = \delta IBAT \times [\eta\_up \times (UBAT-Ud)]/VUP$ →e.g. $IER\_TEST = 0.25$ A×0.9×16V/33V=0.11 A By selecting IER_TEST=120 mA, including additional tolerances, the input current of an airbag control unit may be increased by at least the required value for the purpose of achieving a particular inner resistance resolution of the vehicle electrical system supply of, e.g., <=100 m$\Omega$.

If other requirements are given, a necessary charge current jump of the energy buffer store may be found according to the illustrated relationships.

An example of a measuring process for determining the vehicle electrical system inner resistance is presented below, which may be understood as an example of a control program of charging unit 110:

1) Control unit or charging unit 110 is in the INIT phase (measuring loop RAM counter was reset upon starting the control unit ((=0 set)

2) Check measuring loop RAM counter (MS RAM counter) (forces up to 3 consecutive measuring cycles if measurement is not able to be evaluated)

MS RAM counter=MS RAM counter+1<=3? If yes, run measurement; if no, cancel and

FLASH or EEPROM read-only memory error counter

Do not change "VEHICLE ELECTRICAL SYSTEM INNER RESISTANCE R too high;" resume program with check of error counter "VEHICLE ELECTRICAL SYSTEM INNER RESISTANCE R too high" in step 21).

3) Plausibility of VER; energy buffer store was checked but is not fully charged Is VER(t0)<=25V?; if yes, start measurement→4), if no, cancel→21)

4) Preparation: Set the LIN/K line communication
Set all ignition circuit measurements
All external sensors are deactivated.

5) Switch off charge current controller of the energy buffer store (lup_ER(t1)=0

6) Waiting time for stable conditions to set in

7) Measure step-up converter output voltage VUP(t2)

8) Waiting time for a stable input current to set in (initial value)

9) Measure airbag supply voltage UBAT(t3)

10) Switch on/program charge current controller of the energy buffer store IER(t4)=IER_TEST)

11) Waiting time for a higher stable input current to set in

12) Measure airbag supply voltage UBAT(t5)

13) Switch off charge current controller of the energy buffer store (lup_ER(t6)=0

14) Waiting time for a lower stable input current to set in (initial value)

15) Measure airbag supply voltage UBAT(t7)

16) Plausibility check for constancy of supply voltage during the measurement

Is UBAT(t7)=UBAT(t3)+/−(0 . . . 2LSB)? if yes→(Y); if no (N)

(N) a voltage disturbance has occurred; measurement cannot be carried out

→cancel, go to 2)

(Y) no voltage disturbance has occurred; go to next program step 17)

17) Plausibility check for voltage difference of supply voltage

Is UBAT(t3)−UBAT(t5)>2LSB? If yes→(YY); if no (NN)

(NN) measurement is super good or unable to be evaluated→cancel and go to 2)

(YY) measurement is able to be evaluated; go to next program step 18)

18) Check vehicle electrical system inner resistance R and adjust error counter

Read inner resistance error limit from a data (read-only) memory (FLASH; EEPROM etc.) e.g. 1$\Omega$:

Check whether error limit (resistance threshold) has not been exceeded:

$R = [UBAT(t3) - UBAT(t5)]/\delta IBAT <= 1\Omega$?; if yes ($YYY$); if no ($NNN$)

(NNN) vehicle electrical system inner resistance is too high; →go to 19)

Procedure for inner resistance check: follows at B2)

$R = [UBAT(t3) - UBAT(t5)]/[(IER\_TEST \times VUP)/\{(UBAT(t5) - Ud) \times \eta\_up\}]$ $R = [UBAT(t3) - UBAT(t5)] \times \{(UBAT(t5) - Ud) \times \eta\_up(i)\}/(IER\_TEST \ VUP)$ Take $\eta$_up(i) from stored (data read-only) memory
Efficiency table having input variable UBAT(t5) (see A2)): e.g.

For 5.9 V<$UBAT(t5)$<=7.4V→$\eta\_up(I) = 0.75$

For 7.4 V<$UBAT(t5)$<=9.4V→$\eta\_up(II) = 0.85$

For 9.4V<$UBAT(t5)$→$\eta\_up(III) = 0.9$

Example: where VUP=33V; IER_TEST=120 mA; Ud=0.5V;

$UBAT(t5) - UBAT(t3) = 0.4V$; $UBAT(t5) = 9V$ follows:

$R = 0.4V \times (9V - 0.5V) \times 0.85/0.12 \ A \times 33V$ $R = 2.89V^2/3.96 \ AV = 0.73 \ \Omega <= 1\Omega!$ (YYY) The vehicle electrical system inner resistance for supplying the airbag is okay→go to next program step 20)

19) Increment FLASH/EEPROM error counter "vehicle electrical system inner resistance too high" by 1 step (since it is too high) and resume program in step 21

20) Decrement FLASH/EEPROM error counter "vehicle electrical system inner resistance too high" by 1 step (since it is not too high) (if>=1); otherwise do not and resume program in step 21

21) Check FLASH/EEPROM error counter
Is error counter "vehicle electrical system inner resistance>=1Ω">=10?, if yes (YYYY); if no (NNNN)

(NNNN) no status change of the warning lamp; no increased filtered vehicle electrical system inner resistance has occurred→go to 23)

22) (YYYY) An increased filtered vehicle electrical system resistance has occurred.
Set airbag warning lamp to active (ON) and go to 23)

Figure 3:
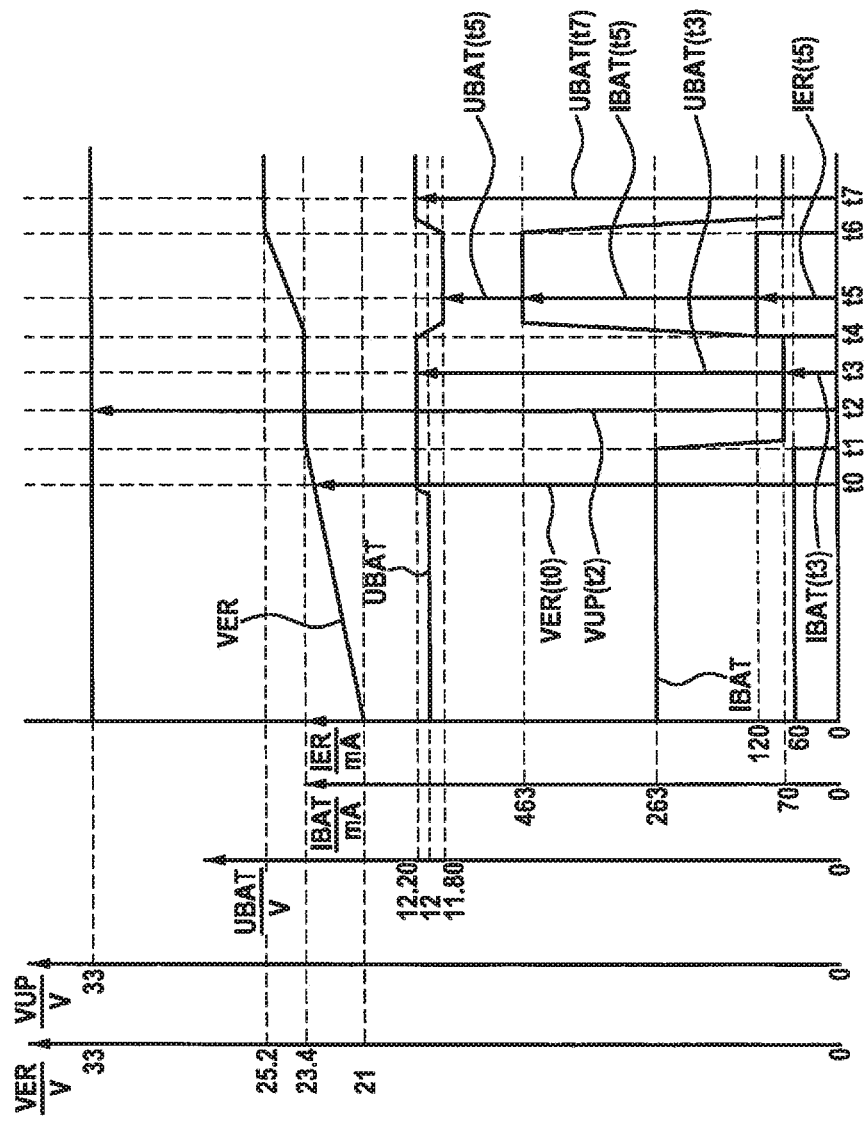
FIG. 3 shows a diagram of a chronological sequence of voltages or currents as a signal sequence of the signals needed for measuring the inner resistance of the vehicle electrical system.

23) Measuring program for vehicle electrical system inner resistance too high END
Resume rest of program Approach 1a) The error counter may be incremented or decremented by different amounts In the diagram from FIG. 3, the precise signal sequence of the signals needed for measuring the vehicle electrical system inner resistance is illustrated on the basis of the illustrated chronological sequence of voltages or currents. In the beginning, the system is in the charging phase of the energy buffer store, e.g. IER=60 mA, after the start of supply. At point in time t0, ER voltage VER is checked to ensure that charge current is still able to be received for measuring the inner resistance. At point in time t1, the charging of the energy buffer store is switched off, whereby VER no longer increases and the supply voltage increases at a finite inner resistance. The control unit now receives the lowest supply current. For control purposes, the output voltage of the step-up converter may be measured (generally invariable, since it is regulated) at point in time t2 or at another suitable point. Battery voltage UBAT is then measured at point in time t3 at a low input current IBAT(t3). At point in time t4, the ER charge current controller is set to a high value (programmed, etc.), e.g. IER(t4)=120 mA. As a result, the supply current of the control unit increases rapidly in a defined manner. In contrast, the battery voltage decreases at a finite inner resistance. UBAT is measured at point in time t5.

The inner resistance may now be inferred from difference UBAT(t3) and UBAT(t5) (e.g., using a table stored in the microcontroller, which specifies a limiting value for UBAT (t3)-UBAT(t5) for each measured value UBAT(t5)) At the end of the measurement, ER charge current controller 110 is switched off again (IER=0 mA) to check for errors during the measuring period. If UBAT(t7)=UBAT(t3), no indication of an error is present. (Time t7-t3 should be kept short).

An example of the vehicle electrical system inner resistance measurement using the following values is illustrated in the diagram: VER(t0)<25 V is measured. According to the design used by way of example, a current I_up_dn=22.5 mA is needed for 100 mA airbag supply current from VAS=6.7 V and η_dn=0.9 at the VUP input of the VAS step-down converter. The external sensors are not yet active. In addition, 60 mA is drawn from VUP for charging the ER. The total current load at VUP is therefore IVUP(t0)=60 mA+22.5 mA=82.5 mA. To raise this current at VUP, battery current is needed at UBAT(t0)=12V, IBAT(t0)=33V*82.5 mA/(0.9*(12V-0.5V))=263 mA.

IER(t1)=ER charge current is switched from 60 mA to 0 mA.

VUP(t2)=33V and UBAT(t3)=12.2 V are measured.

The current at VUP covers only the airbag supply current at VAS IVUP(t3)=I_up_dn=22.5 mA; for this purpose, IBAT (t3)=33V*22.5 mA/(0.9*(12.2V-0.5V))=71 mA is needed on the battery side (measurement is not needed; only a fixed offset value).

Furthermore, η_up=0.9 according to the design and Ud=0.5V from the Schottky polarity reversal protection diode also apply. IER(t4)=ER_charge current is switched from 0 mA to 120 mA as a second charge current value. IER(t5)=120 mA-test current for vehicle electrical system inner resistance R. UBAT(T5)=11.8 V is then measured, for example at the primary interface with the aid of low pass circuit 135.

$$IBAT(t5) = 33\text{ V} * 142.5 \text{ mA}/(0.9 * 11.8\text{ V}-0.5\text{ V}))$$
$$= 463 \text{ mA}$$
$$= IBAT(t3) + 33\text{ V} * 120 \text{ mA}/(0.9 * 11.8\text{ V}-0.5\text{ V})$$

With UBAT(t3)-UBAT(t5)=0.4V, determined by measurement, and IBAT(t3)-IBAT(t5)=0.4 A, determined from the change in the ER charge current (120 mA) and a table or a current measurement with the aid of a shunt in the UBAT line, vehicle electrical system inner resistance R≅1Ω may be determined therefrom.

IER(t6)=ER charge current is switched to 0 mA; ER is then not charged. To establish plausibility, it is then possible to check whether UBAT (t3)=UBAT (t7).

Figure 4:
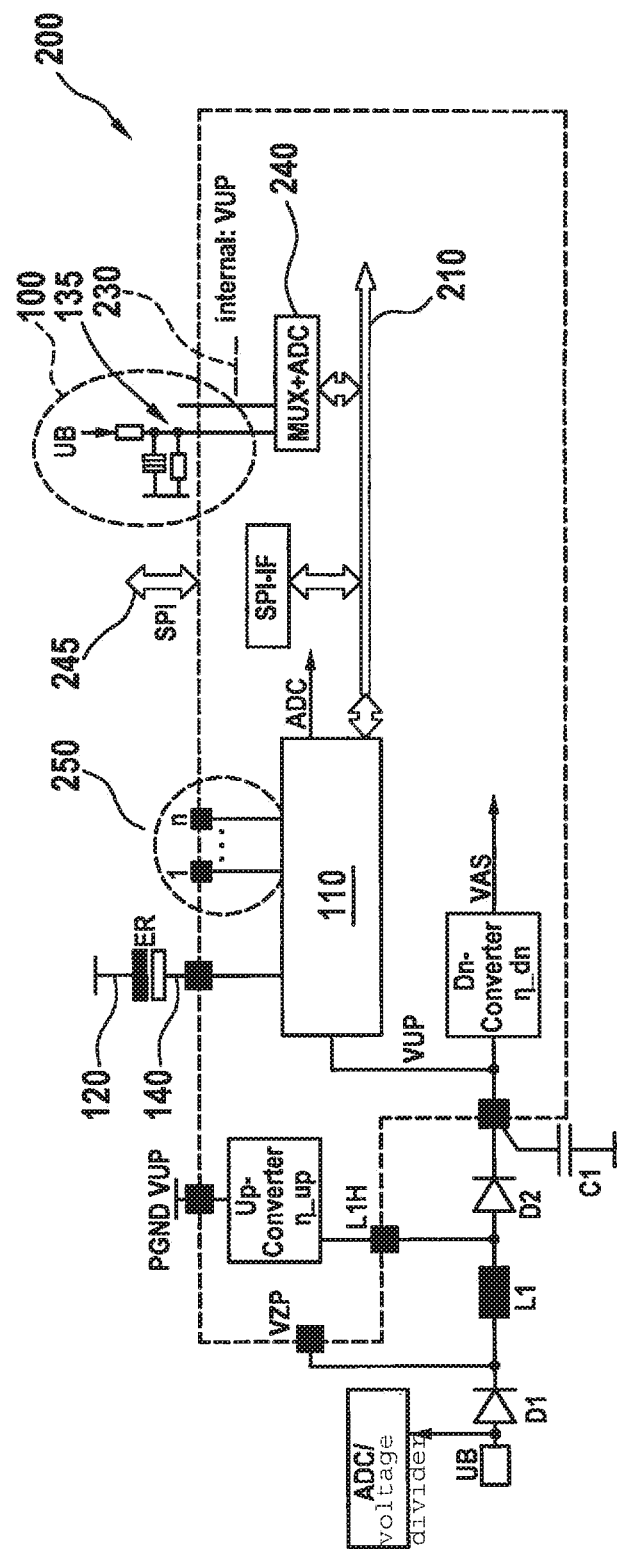
FIG. 4 shows a circuit diagram of a power supply circuit for use in another exemplary embodiment of the present invention.

FIG. 4 shows a circuit diagram of a power supply circuit 200 for use in another exemplary embodiment of the present invention. A step-down converter (dn converter) having output connection VAS for supplying the control unit (external sensors+internal presupply) is connected downstream from the step-up converter.

A charging unit for energy buffer store ER is also connected downstream from the step-up converter. This charging unit 110 may be controlled either via parallel control lines 250 or via a serial interface 245.

The area in an airbag control unit which is also able to cover the requirement for monitoring the vehicle electrical system inner resistance through a suitable adaptation is specially marked in FIGS. 2 and 4. The changes focus on ER charge current controller 110 and the battery voltage detection at primary interface 135. Charge current controller 110 should have a programmable or controllable design and include a new control current level which is able to induce a sufficient current change for inner resistance measurement R on the primary (UBAT) side.

In addition, a suitable UBAT voltage monitoring function having low pass filter 220 is to be provided at an ADC (primary interface 135) for the purpose of detecting (620) the supply voltage change provided by the supply current change based on vehicle electrical system inner resistance R.

Figure 5:
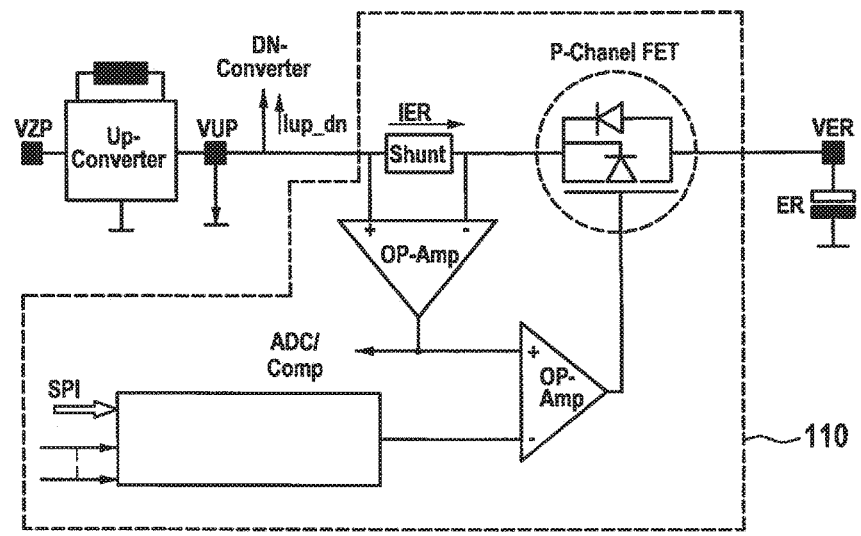
FIG. 5 shows a circuit diagram of a suitable charge current source for the energy buffer store or a power supply circuit for use in one exemplary embodiment of the present invention.

A more precise circuit diagram of a suitable ER charge current source or a power supply circuit 200 is indicated in FIG. 5. The airbag system controller is able to specify different control current levels via a serial interface (e.g. SPI) or a parallel interface. They are used to charge energy buffer store ER.

One current level is sufficient for a standard airbag system, for which purpose controller 110 is usually switched on or off only via control lines. Much higher charging control current values are to be specified for inner resistance measurement R. They may generally not be used for a complete charging of the ER (charging rate, power dissipation too high).

Via more control lines or the full programmability, the ER charging control current is set to high values, limited in time, for inner resistance measurement R of vehicle electrical system 100. According to the illustration in FIG. 5, this takes place by changing the controller reference voltage. Higher reference voltages result in higher control currents at secondary interface 140.

According to an alternative approach, the complex mathematics (division, multiplication) in the approach described above for checking inner resistance R may be transferred to a (lookup) table without any noticeable deterioration.

The procedure for the check is changed thereby as follows:

$UBAT(t5)<6V-7=[UBAT(t3)-UBAT(t5)]=\delta UBAT<=1107$ mV; $\eta\_up=0.65$ $6.0<UBAT(t5)<=6.5V \rightarrow =[UBAT(t3)-UBAT(t5)]=\delta UBAT<=942$ mV; $\eta\_up=0.7$ $6.5<UBAT(t5)<=7.0V \rightarrow =[UBAT(t3)-UBAT(t5)]=\delta UBAT<=812$ mV; $\eta\_up=0.75$ $7.0<UBAT(t5)<=7.5V \rightarrow =[UBAT(t3)-UBAT(t5)]=\delta UBAT<=707$ mV; $\eta\_up=0.8$ $7.5<UBAT(t5)<=8.0V \rightarrow =[UBAT(t3)-UBAT(t5)]=\delta UBAT<=640$ mV; $\eta\_up=0.825$ $8.0<UBAT(t5)<=8.5V \rightarrow =[UBAT(t3)-UBAT(t5)]=\delta UBAT<=600$ mV; $\eta\_up=0.825$ $8.5<UBAT(t5)<=9.0V \rightarrow =[UBAT(t3)-UBAT(t5)]=\delta UBAT<=548$ mV; $\eta\_up=0.85$ $9.0<UBAT(t5)<=9.5V \rightarrow =[UBAT(t3)-UBAT(t5)]=\delta UBAT<=517$ mV; $\eta\_up=0.85$ $UBAT(10.0V<=[UBAT(t3)\rightarrow UBAT(t5)]=\delta UBAT<=476$ mV; $\eta\_up=0.875$ $10<UBAT(t5)<=11V \rightarrow =[UBAT(t3)-UBAT(t5)]=\delta UBAT<=452$ mV; $\eta\_up=0.875$ $11<UBAT(t5)<=12V \rightarrow =[UBAT(t3)-UBAT(t5)]=\delta UBAT<=400$ mV; $\eta\_up=0.9$ $12<UBAT(t5)<=13V \rightarrow =[UBAT(t3)-UBAT(t5)]=\delta UBAT<=366$ mV; $\eta\_up=0.9$ $13<UBAT(t5)<=14V \rightarrow =[UBAT(t3)-UBAT(t5)]=\delta UBAT<=333$ mV; $\eta\_up=0.9125$ $14<UBAT(t5)<=15V \rightarrow =[UBAT(t3)-UBAT(t5)]=\delta UBAT<=309$ mV; $\eta\_up=0.9125$ $15<UBAT(t5)<=16V \rightarrow =[UBAT(t3)-UBAT(t5)]=\delta UBAT<=285$ mV; $\eta\_up=0.925$ $16<UBAT(t5)<=18V \rightarrow =[UBAT(t3)-UBAT(t5)]=\delta UBAT<=267$ mV; $\eta\_up=0.925$ $18<UBAT(t5) \rightarrow =[UBAT(t3)-UBAT(t5)]=\delta UBAT<=237$ mV; $\eta\_up=0.925$ The check in program step 18) then includes only the check of $\delta UBAT$; if this is less than a table value, defined by $UBAT(t5)$, the check resumes in 20);
otherwise in 19).

Another exemplary embodiment of the present invention is apparent in the following description. The table may be reduced in size without any noticeable decrease in the quality of the error detection:

$UBAT(t5)<6V=[UBAT(t3)-UBAT(t5)]=UBAT<=1107$ mV; $\eta\_up=0.65$ $6.0<UBAT(t5)<=6.5V \rightarrow =[UBAT(t3)-UBAT(t5)]=\delta UBAT<=942$ mV; $\eta\_up=0.7$ $6.5<UBAT(t5)<=7.0V \rightarrow =[UBAT(t3)-UBAT(t5)]=\delta UBAT<=812$ mV; $\eta\_up=0.75$ $7.0<UBAT(t5)<=8.0V \rightarrow =[UBAT(t3)-UBAT(t5)]=\delta UBAT<=707$ mV; $\eta\_up=0.8$ $8.0<UBAT(t5)<=9.0V \rightarrow =[UBAT(t3)-UBAT(t5)]=\delta UBAT<=600$ mV; $\eta\_up=0.825$ $9.0<UBAT(t5)<=11V \rightarrow =[UBAT(t3)-UBAT(t5)]=\delta UBAT<=517$ mV; $\eta\_up=0.85$ $11<UBAT(t5)<=14V \rightarrow =[UBAT(t3)-UBAT(t5)]=\delta UBAT<=400$ mV; $\eta\_up=0.9$ $14<UBAT(t5)<=18V \rightarrow =[UBAT(t3)-UBAT(t5)]=\delta UBAT<=309$ mV; $\eta\_up=0.9125$ $18<UBAT(t5) \rightarrow =[UBAT(t3)-UBAT(t5)]=\delta UBAT<=237$ mV; $\eta\_up=0.925$ To ascertain the supply inner resistance, an airbag control unit supply measurement should be carried out at an input current I1{IBAT(t1)} and at an input current I2{IBAT(T2)}, close together in time. The difference in input currents I1, I2 should be selected to be so large that relevant resistances (0.5 . . . 1.5) Ω are resolvable. The resolution limit should be approximately $<=100$ mΩ for airbag systems. To protect the measurement against interference voltages, load changes in vehicle electrical system 100 etc., it is to be suitably filtered. In addition to a low pass filter 220, this also includes a multiple ($>=3$) rapid repetition of the measurement, including checking of the input voltage before and after the measurement.

A filtering of the error over multiple start operations is also suitable for ruling out random errors or special phenomena after long vehicle standstill times.

Airbag control units form the known basis for the approach, which include a step-up converter for generating a regulated output voltage VUP (20 . . . 50)V, e.g. 33V from polarity reversal-protected vehicle voltage VZP (5 . . . 20)V, on the one hand, provide a regulated output voltage VAS (6 . . . 8)V e.g. 6.7V, therefrom via a step-down converter for the further low-loss generation of the necessary system voltages (5V; 3.3V; 1.2V, etc.) as well as external sensor supply, and, on the other hand, include an ON/OFF-switchable energy buffer store charge current controller for charging the ER to approximately VUP.

Figure 6:
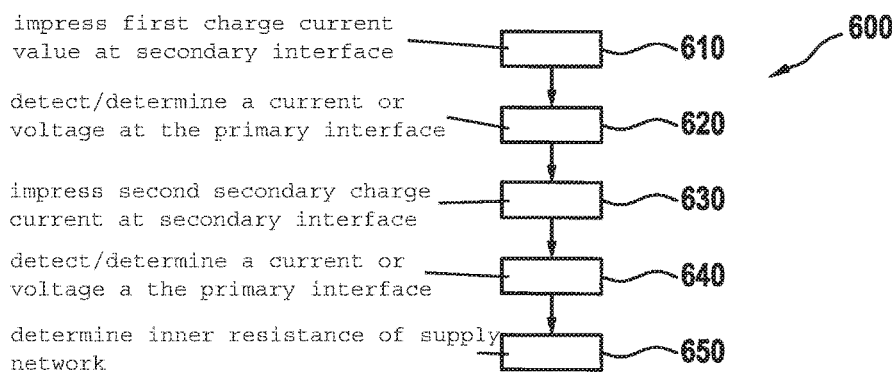
FIG. 6 shows a flow chart of one exemplary embodiment of the present invention as a method.

FIG. 6 shows a flow chart of one exemplary embodiment of a method 600 for ascertaining an inner resistance of a supply network for supplying energy.

The method includes a step of impressing 610 a first charge current value at secondary interface 140. The method also includes a step of detecting 620 or determining a current and/or a voltage at the primary interface (UB coupling to the supply unit of the control unit) during impression 610 of a first secondary charge current at secondary coupling 140 to energy buffer store (ER) via a suitable test circuit 135. Method 600 also includes a step 630 of impressing a second secondary charge current, which differs from the first one, at secondary coupling 140 to energy buffer store (ER) and a step 640 of a renewed detection or determination of a current and/or a voltage at the primary interface (UB) via a suitable test circuit.

There is also a step of determining 650 inner resistance R of supply network 100, using the detected or determined current and/or the detected voltage during the step of impressing 610 and using the detected or determined current and/or detected 620 voltage during the step of impressing 630. Or by determining the current change at the primary interface via an assignment table, based on the defined current difference between secondary charge current value 2 and secondary charge current value 1 of the converter characteristic (efficiency) and the selection criterion of the measured primary voltage.

In other words, FIG. 6 shows a flow chart of one exemplary embodiment of a method 600 for ascertaining an inner resistance of a supply network for supplying energy. The occupant protection system includes a charging unit, which is connected to the supply network with the aid of a primary interface and to an energy buffer store with the aid of a secondary interface for the temporary storage of energy for activating occupant protection devices of the occupant protection system and for supplying the occupant protection system after being separated from the supply network. Method 600 includes a step 610 of impressing a first charge current value at the secondary interface. The method furthermore includes a step 620 of detecting a first current and/or a first voltage at the primary interface during the step of impressing 610. Method 600 also includes a step 630 of impressing a second charge current value, which differs from the first charge current value, at the secondary interface. Method 600 also includes a step 640 of determining a second current and/or a second voltage at the primary interface during the impression. Finally, method 600 includes a step 650 of ascertaining the inner resistance of the supply network, using the first current and the second current and/or the first voltage and the second voltage.

The exemplary embodiments described and shown in the figures have only been selected as examples. Different exemplary embodiments may be combined with each other in their entirety or with regard to their individual features. Also, one exemplary embodiment may be supplemented with features of another exemplary embodiment.

Furthermore, the method steps presented herein may be repeated and carried out in a sequence different from the one described. If an exemplary embodiment has an "and/or" linkage, between a first feature and a second feature, this is to be read in such a way that the exemplary embodiment has both the first feature and the second feature according to one specific embodiment and either only the first feature or only the second feature according to another specific embodiment.

What is claimed is:

1. A method for ascertaining an inner resistance of a supply network for supplying energy to an occupant protection system of a vehicle, the method comprising:

impressing a first charge current value at a secondary interface of an occupant protection system, the occupant protection system having a control unit including a charging unit which is connected to the supply network with a primary interface and to an energy buffer store with the secondary interface for temporary storage of energy for activating an occupant protection device of the occupant protection system and for supplying the occupant protection system after being separated from the supply network;

detecting at least one of a first current and a first voltage, at the primary interface during the impressing of the first charge current value;

impressing a second charge current value, which differs from the first charge current value, at the secondary interface;

determining at least one of a second current and a second voltage at the primary interface during the impressing of the second charge current value; and ascertaining at the primary interface the inner resistance of the supply network, using at least one of: i) the first current and the second current, and ii) the first voltage and the second voltage;

wherein the inner resistance, which is along a measurement path, includes a sum of all resistances between a positive terminal and a ground terminal of the charging unit.

2. The method as recited in claim 1, wherein in the ascertaining step, the inner resistance is determined using an at least one of: i) an efficiency ($\eta$) of the charging unit, ii) the first charge current value, and iii) the second charge current value.

3. The method as recited in claim 1, wherein at least one of: i) the at least one of the first current and the first voltage, and ii) the at least one of the second current and the second voltage, is low-pass filtered in the one of the detecting step and the determining step.

4. The method as recited in claim 1, wherein the second charge current value is higher than the first charge current value, the second charge current value being selected, compared to the first charge current value, so that an inner resistance, which is smaller than a predetermined inner resistance of the supply network is determinable from at least one of: i) the at least one of the first current and the first voltage, and ii) the at least one of the second current and the second voltage at the primary interface in the ascertaining step, as a function of an efficiency ($\eta$) of the charging unit.

5. The method as recited in claim 1, wherein the second charge current value is impressed within a predetermined period of time after the impression of the first charge current value in the step of impressing the second charge current value.

6. The method as recited in claim 1, wherein at least one of: i) the inner resistance is determined in the ascertaining step, using a lookup table, ii) the at least one of the first current and the first voltage is detected in the detecting step using a lookup table, and ii) the at least one of the second current and the second voltage are determined in the determining step using a lookup table.

7. The method as recited in claim 1, wherein the steps of impressing first charge current value, detecting, impressing the second charge current value, and determining are carried out chronologically multiple times consecutively, the inner resistance being determined in the ascertaining step as a function of at least one of the first currents detected in the steps of impressing and the first voltages detected in the steps of impressing, and using the at least one of the second currents and the second voltages detected in the determining steps.

8. The method as recited in claim 1, wherein the inner resistance determined along the measurement path includes at least the following resistances: $\Sigma$ of all resistors on a circuit board from a connector of the control unit for positive supply to the control unit circuit supply; $\Sigma$ of all contact resistors of a plug connection of a battery to the circuit board; $\Sigma$ of all resistors of a cable battery connection from the battery positive terminal to the control unit; $\Sigma$ of all resistors of fuses in a feed line; Σ of all contact resistors in the batter connection from the battery positive terminal to the battery.

9. The method as recited in claim 8, wherein the inner resistance determined along the measurement path includes at least the following further resistances: an inner resistance of the vehicle battery if the motor is off or an inner resistance of a generator if the motor is on; a transfer resistance of a battery/generator ground connection to a vehicle chassis; a vehicle chassis inner resistance; a transfer resistance of the vehicle chassis to a base plate of the control unit; Σ of all contact resistors of the base plate of the control unit base plate the ground connection of the circuit board; Σ of all resistors from the ground connection of the circuit board to a ground supply of the supply circuit.

10. The method as recited in claim 1, wherein the inner resistance determined along the measurement path includes at least the following resistances: an inner resistance of the vehicle battery if the motor is off or an inner resistance of a generator if the motor is on; a transfer resistance of a battery/generator ground connection to a vehicle chassis; a vehicle chassis inner resistance; a transfer resistance of the vehicle chassis to a base plate of the control unit; Σ of all contact resistors of the base plate of the control unit base plate the ground connection of the circuit board; Σ of all resistors from the ground connection of the circuit board to a ground supply of the supply circuit.

11. A method for outputting an error message for providing information about a malfunction of a supply network for supplying energy to an occupant protection system of a vehicle, the method comprising:
  impressing a first charge current value at a secondary interface of an occupant protection system, the occupant protection system having a control unit including a charging unit which is connected to the supply network with a primary interface and to an energy buffer store with the secondary interface for temporary storage of energy for activating an occupant protection device of the occupant protection system and for supplying the occupant protection system after being separated from the supply network;
  detecting at least one of a first current and a first voltage, at the primary interface during the impressing of the first charge current value;
  impressing a second charge current value, which differs from the first charge current value, at the secondary interface;
  determining at least one of a second current and a second voltage at the primary interface during the impressing of the second charge current value;
  ascertaining at the primary interface the inner resistance of the supply network, using at least one of: i) the first current and the second current, and ii) the first voltage and the second voltage; and
  providing the error message when the inner resistance is in a predetermined relationship to a resistance threshold;
  wherein the inner resistance, which is along a measurement path, includes a sum of all resistances between a positive terminal and a ground terminal of the charging unit.

12. A device for ascertaining an inner resistance of a supply network for supplying energy to an occupant protection system of a vehicle, comprising:
  a non-transitory computer readable storage medium storing a program, which is executable by a processor, including a program arrangement having program code for ascertaining an inner resistance of a supply network for supplying energy to an occupant protection system of a vehicle, by performing the following:
    impressing a first charge current value at a secondary interface of an occupant protection system, the occupant protection system having a control unit including a charging unit which is connected to the supply network with a primary interface and to an energy buffer store with the secondary interface for temporary storage of energy for activating an occupant protection device of the occupant protection system and for supplying the occupant protection system after being separated from the supply network;
    detecting at least one of a first current and a first voltage, at the primary interface during the impressing of the first charge current value;
    impressing a second charge current value, which differs from the first charge current value, at the secondary interface;
    determining at least one of a second current and a second voltage at the primary interface during the impressing of the second charge current value; and
    ascertaining at the primary interface the inner resistance of the supply network, using at least one of: i) the first current and the second current, and ii) the first voltage and the second voltage;
    wherein the inner resistance, which is along a measurement path, includes a sum of all resistances between a positive terminal and a ground terminal of the charging unit.

13. A non-transitory computer readable storage medium storing a program, which is executable by a processor, comprising:
  a program arrangement having program code for ascertaining an inner resistance of a supply network for supplying energy to an occupant protection system of a vehicle, by performing the following:
    impressing a first charge current value at a secondary interface of an occupant protection system, the occupant protection system having a control unit including a charging unit which is connected to the supply network with a primary interface and to an energy buffer store with the secondary interface for temporary storage of energy for activating an occupant protection device of the occupant protection system and for supplying the occupant protection system after being separated from the supply network;
    detecting at least one of a first current and a first voltage, at the primary interface during the impressing of the first charge current value;
    impressing a second charge current value, which differs from the first charge current value, at the secondary interface;
    determining at least one of a second current and a second voltage at the primary interface during the impressing of the second charge current value; and
    ascertaining at the primary interface the inner resistance of the supply network, using at least one of: i) the first current and the second current, and ii) the first voltage and the second;
    wherein the inner resistance, which is along a measurement path, includes a sum of all resistances between a positive terminal and a ground terminal of the charging unit.

* * * * *